United States Patent [19]

Ohtsuka et al.

[11] Patent Number: 5,412,609
[45] Date of Patent: May 2, 1995

[54] NONVOLATILE SEMICONDUCTOR MEMORY DEVICE

[75] Inventors: Nobuaki Ohtsuka, Kawasaki; Junichi Miyamoto, Yokohama, both of Japan

[73] Assignee: Kabushiki Kaisha Toshiba, Kawasaki, Japan

[21] Appl. No.: 215,483

[22] Filed: Mar. 21, 1994

[30] Foreign Application Priority Data

Apr. 30, 1993 [JP] Japan ................ 5-104406

[51] Int. Cl.⁶ .............................................. G11C 7/00
[52] U.S. Cl. .............................. 365/218; 365/230.03; 365/189.11
[58] Field of Search ............ 365/218, 230.03, 230.06, 365/185, 189.11

[56] References Cited

U.S. PATENT DOCUMENTS

5,283,758  2/1994  Nakayama .............. 365/230.03

Primary Examiner—Joseph A. Popek
Assistant Examiner—A. Zarabian
Attorney, Agent, or Firm—Banner, Birch, McKie & Beckett

[57] ABSTRACT

Word lines are divided into a plurality of blocks in a row direction, and divided into a plurality of sections having e.g., four word lines in a column direction. An area where each block and each section are crossed is used as a sector. One sector includes four word lines. A control gate of a plurality of transistors constituting a memory cell is connected to each of the word lines, each drain is connected to each of the bit lines, and each source is connected to each of source lines in common. A source main decoder is provided in each section, source sub-decoders are provided in each sector. Each source sub-decoder includes each of supply circuits. The source main decoder outputs a sector selection signal in accordance with a row address signal, and a block decoder outputs block selection signals in accordance with a column address signal. One supply circuit is selected by the sector selection signal and the block selection signals, and the selected supply circuit supplies the sector selection signal outputted from the source main decoder source lines as an erase signal.

20 Claims, 6 Drawing Sheets

| | WRITING | READING | ERASING (SE) | ERASING (SGE) |
|---|---|---|---|---|
| GATE | Vgp / 0 | Vgr / 0 | 0 / 0 | Vge / 0 |
| DRAIN | Vdp / OPEN | Vdr / OPEN | OPEN | OPEN |
| SOURCE | 0 / 0 | 0 / 0 | VSE / 0 | VSE / 0 |

NOTE: SELECTIVE CELL / NON-SELECTIVE CELL

NONVOLATILE SEMICONDUCTOR MEMORY DEVICE

BACKGROUND OF THE INVENTION

1. Field of the Invention

The present invention relates to a nonvolatile semiconductor memory device and, more particularly to a flash memory which can select a source terminal and flash-erase memory data.

2. Description of the Related Art

The flash memory is a nonvolatile semiconductor memory, which can electrically write and erase data, and comprises an EEPROM (Electrically Erasable Programmable Read Only Memory). Particularly, the flash memory can flash-erase data by a predetermined unit. In the conventional flash memory, data stored in all memory cells of the chip was flash-erased (chip erase). However, in accordance with the large capacities of the memory, it has been required that data be rewritten by a small unit. Due to this, in recent years, the chip is divided into several blocks, and data can be block-erased by each block unit.

Also, in accordance with the advance in the large capacities of the flash memory, an electrical disk has been replaced by the flash memory. Then, it has been desired that the data writing unit be arranged to be a sector size of the electrical disk. Due to this, it is needed that data erasing be performed by the unit of 512 B (B: Byte), which is called as a sector erase. There is a tendency that the erase unit of the flash memory is made smaller in order of the chip erase, block erase, and sector erase. Particularly, in the flash memory of the large capacity, data erase by the sector unit is important.

The following will explain the cell data writing and erasing in the flash memory. The data writing and erasing is that a threshold voltage of a cell transistor is changed.

Figure 9:
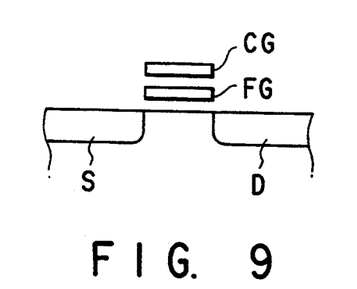
FIG. 9 is a view showing a cell of a flash memory.

FIG. 9 shows a flash memory cell, which is mainly used at present. The memory cell has the same structure as an EPROM (Erasable Programmable Read Only Memory: PROM of ultraviolet ray erasing type) having a double gate structure. In this type of the memory cell, the data writing is exactly the same as EPROM. In other words, a source terminal S is grounded, and high voltage for writing is applied to a control gate CG and a drain D. Then, a hot electron generated close to the drain D is implanted to a floating gate, and the threshold voltage of the cell transistor is increased.

Figure 10A:
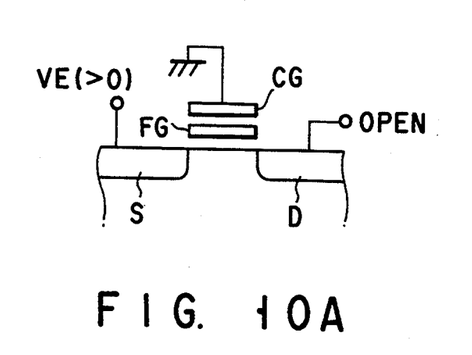
FIGS. 10A and 10B are views each explaining a method for erasing data of the flash memory.

The following will explain two typical methods for erasing data. The first method is a source erase method (hereinafter called as SE). According to this method, as shown in FIG. 10A, the control gate CG is grounded, the drain D is opened, and high voltage VE for erasing (>0) is applied to the source S. Then, a high electrical field is applied between the source and floating gate FG, and a tunnel current is generated. Thereby, an electron in the floating gate is drawn to the source S.

Figure 10B:
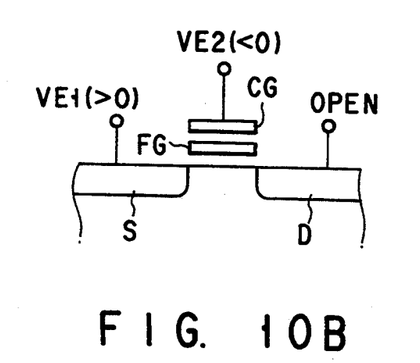

The second method is a source gate erase method (hereinafter called as SGE). According to this method, as shown in FIG. 10B, the drain D is in the same state as FIG. 10A. The source S is biased to VE1 (>0), and the control gate CG is biased to a negative voltage VE2 (<0). In the SEG method, the electrical field between the source and the floating gate, which is necessary for generation of a tunnel phenomenon, is generated by biasing the control gate to the negative voltage. Due to this, the SEG method has an advantage that the voltage to be applied to the source can be reduced as compared with the method shown in FIG. 10A. Therefore, in the SGE method, it is needed that the negative bias is supplied to the control gate, that is, the word line. However, in the SGE method, there can be overcome a problem in that a high break down voltage of the source is lowered in accordance with miniaturization. Moreover, it can be said that the SGE method is superior to the SE method in the point that the erase voltage is made lower, thereby making it easy to provide a single power source. In both methods, data is erased by drawing the electron from the floating gate, and reducing a threshold voltage of the cell transistor.

Figure 11:
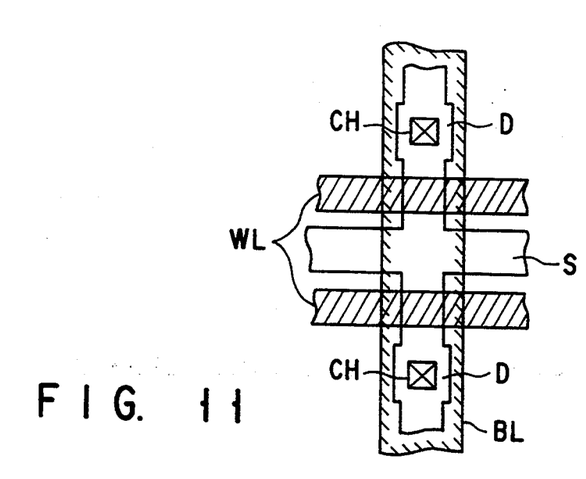
FIG. 11 is a plane view showing a pattern of the flash memory.

The following will explain the structure of the memory cell array, which is actually provided on the chip. A large number of word lines and a large number of bit lines are arranged to be perpendicular to each other in the memory cell array. FIG. 11 shows a part of the structure which is enlarged. The drains D are connected to the bit line BL, which is formed of an aluminum wire, through a contact hole CH every two cells adjacent in a vertical direction shown in the figure. The sources S are connected to each other every two cells adjacent in a vertical direction shown in the figure. Moreover, the sources of the memory cell (not shown) adjacent in a horizontal direction are connected to each other by a diffusion layer. The control gate CG is connected to the memory cell (not shown) adjacent in the horizontal direction, thereby forming a word line WL. The sources are provided in a portion, which is between two word lines WL and which is perpendicular to these word lines.

Here, the division of the memory array will be considered as follows:

The main cause that the division of the memory cell array is needed is the delay of access time. In the case that the number of cells per bit line and the number of cells per word line are increased, a parasitic capacity of the cell and a parasitic resistance of the cell largely delay the signal. Due to this, in consideration of the influence on access time, the memory cell array is divided as required.

Next, the division of the memory cell array in accordance with the erase unit will be considered as follows:

As mentioned above, in the case of the chip erase, since all cells are flash-erased, there is no need that the source and control gate (word line) are divided. However, in the case of the block erase, it is needed that the source be divided every erase block in the SE method. Also, it is needed that the source and word line be divided every erase block in the SGE method. According to the SE and SEG method, in each divided block, the erase voltage is applied to the memory cell through the commonly connected source. In the case of the SGE method, in order that the word lines can be individually controlled every block, it is required that a row decoder is provided in each block. However, the number of divisions of the word lines is normally determined to be linked with the division, which is performed in accordance with access time though the number of divisions differs depending on the capacity of the chip and the size of the erase block. Due to this, the number of divisions of the word lines is controlled to the extent that no problem occurs if the chip area is increased in erasing the blocks.

In contrast, in the case of the sector erase, since the erase is small, i.e., 512 B, one sector is generally formed of a several numbers of word lines. As shown in FIG. 11, the source is shared by two cells adjacent in the vertical direction. Due to this, in both cases of SE and SGE, two rows sharing the source are erased at the same time, and the sector is normally formed of at least two row units. In this case, so as to realize the sector size of 512 B, if the number of memory cells to be connected to one word line is 2 Kb, two row units are set, and if the number of memory cells is 1 Kb, four row units are set. In other words, an equation of 2 Kb×2=1 Kb×4=512 B is established.

Moreover, if the following process is provided, the sector can be divided into one row unit, and the number of memory cells per word line may be 4 Kb. More specifically, in the case of the SE method, in the two rows sharing the source, one word line is grounded, and set to be in an erasing state, and the other word line is biased to an intermediate such that the electric field between the floating gate and the source is relaxed and no erasing occurs. In this case, all memory cells to be connected to the word lines, which are biased to the intermediate voltage, must be set to satisfy two conditions, that is, data of the memory cell in a writing state is not erased, and data is not written in the memory cell, which is originally set in an erasing state. Therefore, suitable intermediate voltage, which satisfies the above two conditions, is needed.

Figure 12:
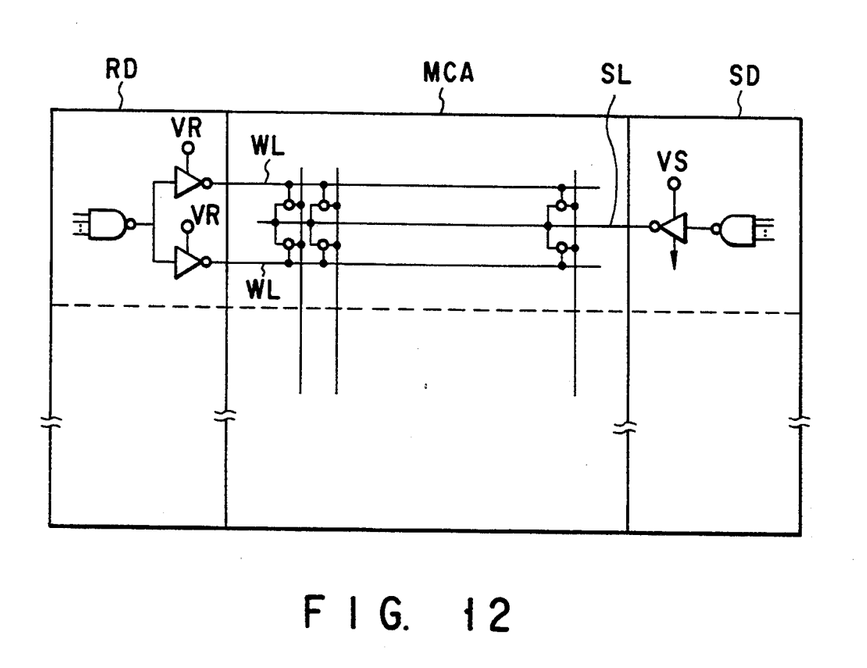
FIG. 12 is a schematic structural view showing a method for dividing word lines in accordance with the sector.
Figure 13:
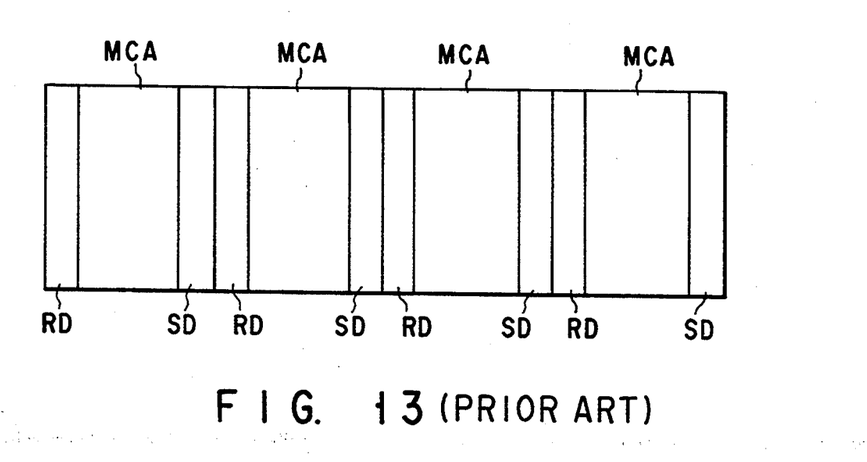
FIG. 13 is a schematic view showing the structure of a conventional flash memory.

FIG. 12 shows the division of the word lines in accordance with the sectors, that is, the division of the sectors. In the case of the sector division, the source lines SL (diffusion layer) are provided in the same direction as the word lines WL provided in the memory cell array MCA. It is needed that the erase voltage be applied to the source lines every sector. Due to this, as shown in FIG. 12, a source decoder SD is required so as to select the source in accordance with the address selected by the row decoder RD. The source decoder SD has a function of selecting the source in accordance with the row address, and level-converting the selected signal to a high voltage for erasing. In the SE and SGE methods, since a current flows into the source at the time of erasing because of the tunnel current between bands, current driving source is required in the transistor constituting the source decoder SD, and the transistor having a sufficient size must be ensured.

The following will explain the sector erase, whose importance is considered to be further increased in accordance with the large capacities of the memory. As mentioned above, in the case of the sector erase, the number of memory cells per one word line is limited by the sector size. In the example of FIG. 12, the number of memory cells per one word line is 2 Kb, and the sector size of 512 B can be obtained. If the number of memory cells per one bit line is set to 2 Kb, the capacity of the chip is 4 Mb and no division of the word lines can be realized. The flash memory, which is manufactured at present, has such a degree of the capacity. However, the flash memory having a capacity of 16 Mb or 64 Mb has already developed, and it is expected that the large capacity of the flash memory is further advanced. If the number of the memory cells per one word line is further increased in accordance with the large capacities of the memory, the word line division is indispensable for controlling the number of memory cells per one word line to 2 Kb. Moreover, high speed of access time has been strongly required in addition to the large capacity of the memory. The delay of the word line largely influences access time. In order to control the delay of the word line, it is needed that the number of memory cells per word line be reduced. Also, it is required that the word lines be divided in view of the high speed access. For these reasons, it is essential that the word lines be divided into a plurality of blocks, and that the source lines be not only decoded by the row address but also be selectively controlled every block.

As mentioned above, in the case of the sector erase, not only the row decoder RD but also complex structured source decoder SD is required every block. Due to this, in the case that the word lines are simply divided, the number of row decoders RD and that of source decoders SD are increased in proportion to the number of divisions. Therefore, there occurs a problem in which the chip size is enlarged as the number of the source decoders is increased, so that the manufacturing cost rises. Moreover, in the case of the memory having the large capacity, there are limitations such as size of an exposing area of the manufacturing device and a package size in enlarging the chip size.

SUMMARY OF THE INVENTION

An object of the present invention is to provide a nonvolatile semiconductor memory device which can control the increase in a chip size and maximize the increase in a manufacturing cost, thereby making it possible to erase sectors.

The object of the present invention can be attained by the following structure.

More specifically, according to the present invention there is provided a nonvolatile semiconductor memory device comprising a memory cell array including a plurality of sectors arranged in row and column directions, each of the sectors including a plurality of word lines, a plurality of bit lines arranged to cross the word lines, and a plurality of transistors constituting a memory cell, and a gate of each of the transistors being connected to the same word line, one end of a current path being connected to each bit line, and other end of the current path being connected in common; first selecting means for selecting the plurality of sectors arranged in one row in accordance with an address signal so as to output an erase voltage; second selecting means for selecting the plurality of sectors arranged in one column in accordance with the address signal; and supplying means, provided in each of the sectors, for supplying the erase voltage outputted from the first selecting means to the other end of the current path connected in common.

According to the present invention, supplying means is provided to correspond to each of the divided sectors, so that the erase of the unit of the sector can be performed. Moreover, since the structure of supplying means is simple, the increase in the chip size in dividing the word lines can be minimized, and the manufacturing cost can be reduced.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained with reference to the drawings.

Figure 1:
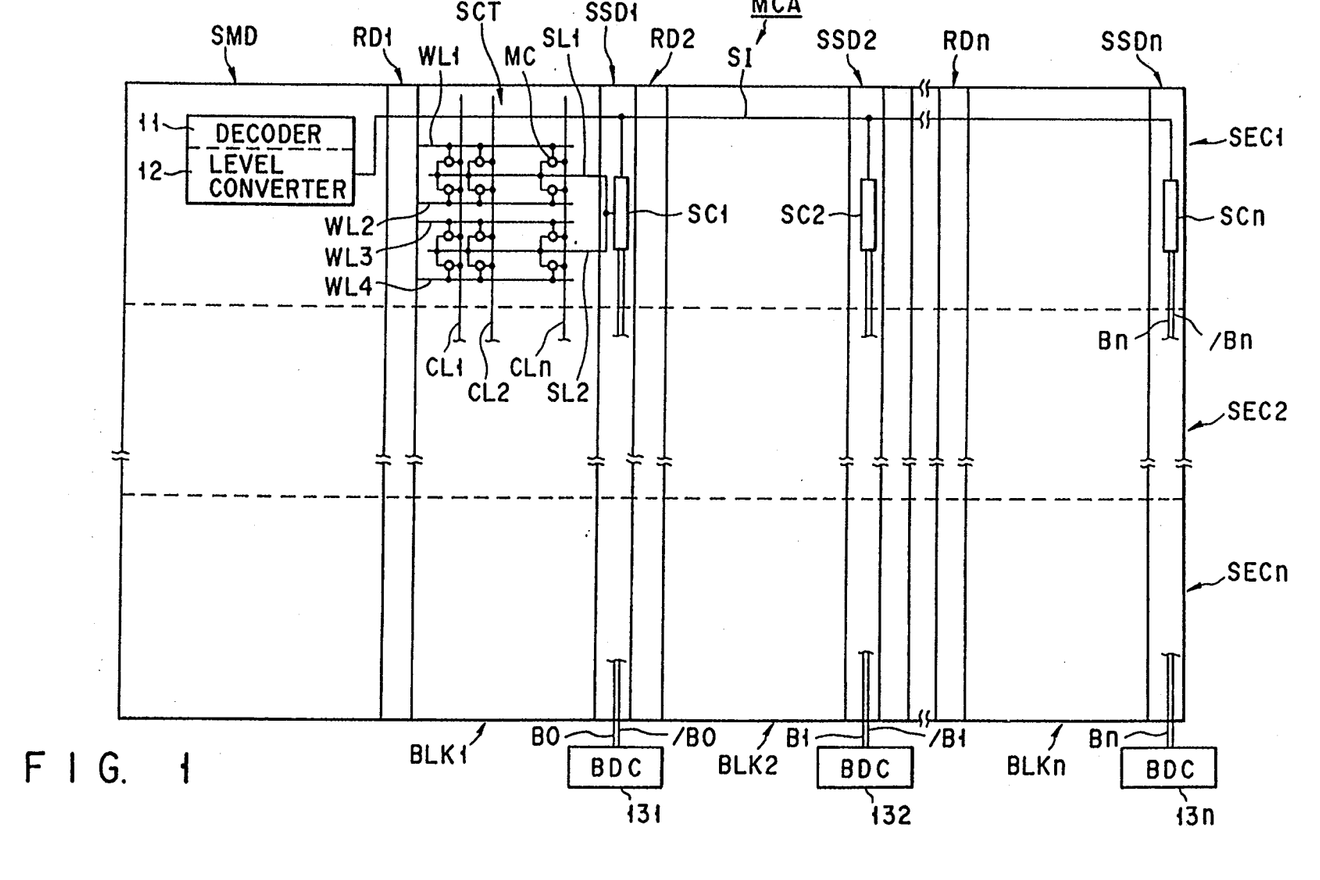
FIG. 1 is a schematic structural view showing a first embodiment of the present invention.

FIG. 1 is a first embodiment of the present invention.

In a memory cell array MCA shown in FIG. 1, word lines are divided into a plurality of blocks BLK1 to BLKn in a row direction. Moreover, word lines are divided into sections SEC1 to SECn, e.g, having four word lines in a column direction. A sector SCT is formed in an area where one block and one section are crossed. Therefore, one block and one section are formed of a sector group having a plurality of sectors, respectively. One sector SCT includes four word lines WL1 to WL4, and memory cells MC, e.g., 1 Kb memory cells MC are connected to one word line. Therefore, one sector SCT is 512 B. As mentioned above, the plurality of memory cells MC are arranged to constitute the memory cell array MCA. The memory cell MC comprises an EPROM as shown in FIG. 9. The EPROM has a control gate, a floating gate, a source and a drain. The number of word lines included in the sector may be one or more. In this case, each source of the transistor constituting the memory cell is connected to a source line in common.

In the blocks BLK1 to BLKn (sector SCT), a control gate (not shown) of the memory cell MC is connected to each of the word lines WL1 to WL4. The drain (not shown) of each memory cell MC is connected to each of column lines (bit lines) CL1 to CLn, and each of sources is connected to each of the source lines SL1 and SL2. In other words, the source of each memory cell MC provided between the word lines WL1 and WL2 is connected to the source line SL1 in common, and the source of each memory cell MC provided between the word lines WL3 and WL4 is connected to the source line SL2 in common. Each of row decoders RD1 to RDn is provided to each of the blocks BLK1 to BLKn.

The row decoders RD1 to RDn select the word line of each block in accordance with an address.

On the other hand, a source decoder for selecting the source lines SL1 and SL2 is provided every section SEC1 to SECn. Each source decoder is divided into one source main decoder SMD and a plurality of source sub-decoders SSD1 to SSDn. The source main decoder SMD is provided to be adjacent to the row decoder RD1, and the source sub-decoders SSD1 to SSDn are provided in each of the blocks BLK1 to BLKn. Each source main decoder SMD has a decoder 11 and a level converter 12. The decoder 11 decodes a row address signal, and the level converter 12 level-converts an output of the decoder 11 to an erase voltage VSE, and outputs the voltage as a sector selection signal SI. The erase voltage VSE is set to have a higher level than the high level of the row address signal. The sector selection signal SI is supplied to each of source sub-decoders SSD1 to SSDn. These source sub-decoders SSD1 to SSDn include supply circuit SC1 to SCn, respectively. These supply circuit SC1 to SCn supply the sector selection signal SI to the source line of a predetermined block in response to block selection signals B0, /B0, B1, /B1 to Bn, and /Bn (/ denotes an reverse signal), respectively. In the vicinity of each of the source sub-decoders SSD1 to SSDn, block decoder (BDC) 131, 132 to 13n are provided. These block decoders 131, 132 to 13n decode a column address signal, and generate each of block selection signals B0, /B0, B1, /B1 to Bn, and /Bn for selecting blocks BLK1 to BLKn.

One sector can be selected by the source main decoder SMD, source sub-decoders SSD1 to SSDn, and block decoders BDC 131, 132 to 13n. Thereby, the memory cell MC, which is connected in common to the source lines SL1 and SL2 of the selected sector, can be arbitrarily selected.

Figure 2:
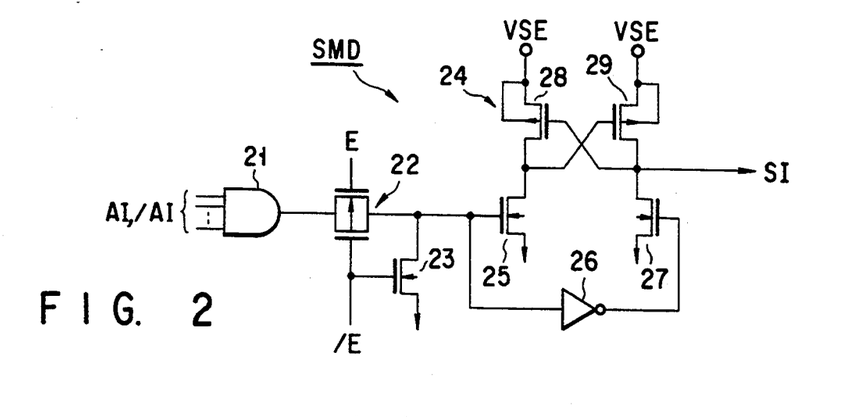
FIG. 2 is a circuit view showing one example of a source main decoder shown in FIG. 1.
Figure 3:
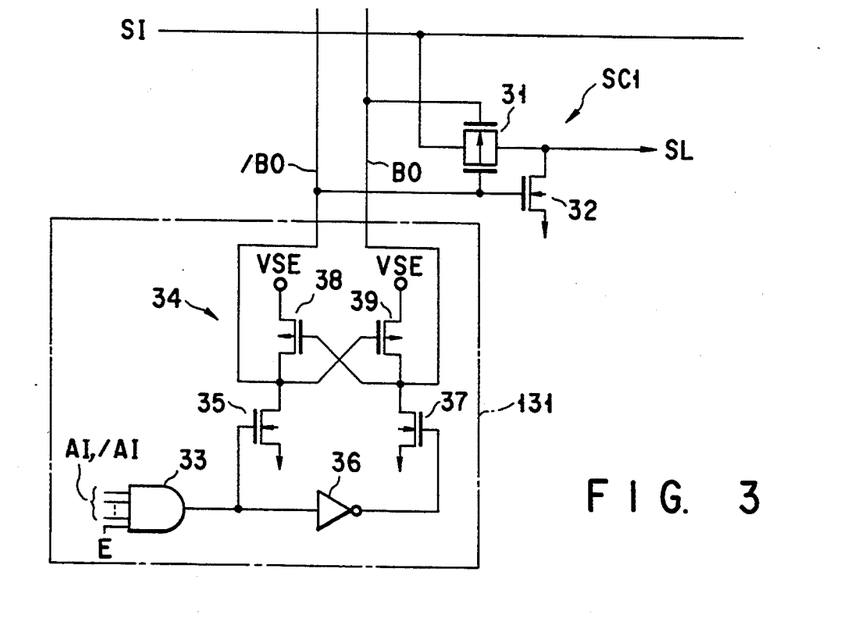
FIG. 3 is a circuit view showing one example of a source sub-decoder shown in FIG. 1.

FIG. 2 shows one example of the source main decoder SMD, and FIG. 3 shows one example of the supply circuit SC1 constituting the source sub-decoder SSD1.

In the source main decoder SMD shown in FIG. 2, row address signals AI and /AI (I=0 to n, / denotes an inverse signal) are inputted to an AND circuit 21. The combination of the row address signals AI and /AI to be supplied to the AND circuit 21 is changed every decoder provided in each of sections SEC1 to SECn, and only one output signal of the AND circuit is set to be in a high level in accordance with the row address signal. An output terminal of the AND circuit 21 is connected to an input terminal of a transfer gate 22. An erase control signal E is supplied to a gate of an N channel transistor constitutes the transfer gate 22, and an inverted control signal /E is supplied to a gate of a P channel transistor. The erase control signal E is set to be in a high level at the time of erasing. A drain of an N channel transistor 23 for resetting is connected to an output terminal of the transfer gate 22. A source of the transistor 23 is grounded, and a gate thereof is connected to the gate of the P channel transistor. The signal passing from the AND circuit 21 to the output of the transfer gate 22 is a signal of a power supply voltage Vcc system.

Also, the output terminal of the transfer gate 22 is connected to both a gate of an N channel transistor 25 constituting a level converter 24 and a gate of an N channel transistor 27 through an inverter 26. Each source of the transistors 25 and 27 is grounded. A drain of the transistor 25 is connected to both a drain of a P channel transistor 28 and a gate of a P channel transistor 29. A drain of the transistor 27 is connected to both a drain of a P channel transistor 29 and a gate of the P channel transistor 28. A voltage VSE for erasing is supplied to each source of the transistors 28 and 29. The sector selection signal SI is outputted from each drain of the transistors 27 and 29.

In the above-mentioned structure, since the erase control signal E is set to be in a high level at the time of erasing, the transistor 23 is in a non-conductive state, and the transfer gate 22 is in a conductive state. On the other hand, the output signal of the AND circuit 21, which is selected in accordance with the row address signal, is set to be in a high level. The output signal of the AND circuit 21 is supplied to the level converter 24 through the transfer gate 22. The level converter 24 converts the inputted high level signal of the voltage Vcc system to a signal of the voltage VSE system, and the converted signal is outputted as an erase signal. Therefore, the sector selection signal SI of the selected sector becomes the voltage VSE, and the sector selection signal SI of the non-selected sector is set to be in a ground level.

On the other hand, since the erase control signal E is set to be in a low level at the time of not erasing, the transfer gate 22 is in a non-conductive state, and the transistor 23 is in a conductive state. Due to this, the input terminal of the level converter 24 is grounded. Therefore, the sector selection signal SI is set to be in a grounded level regardless of the row address signals AI, /AI.

FIG. 3 shows a supply circuit SC1 included in the source sub-decoders SSD1 to SSDn. In FIG. 3, the sector selection signal SI outputted from the main source decoder MSD is supplied to an input terminal of a transfer gate 31. An output terminal of the transfer gate 31 is connected to the source line SL and a drain of a transistor 32 for reset. The source of the transistor 32 is grounded, and its gate is connected to the gate of a P channel transistor constituting the transfer gate 31. Block selection signals B0, and /B0, which are outputted from a block decoder 131, are supplied to the gate of N channel transistor constituting the transfer gate 31 and the gate of the P channel transistor.

The block decoder 131 comprises an AND circuit 33 and a level converter 34. The AND circuit 33 decodes column address signals AI and /AI (I=0 to n) and the erase control signal E. The level converter 34 level-converts an output signal of a power supply voltage Vcc, which is outputted from the AND circuit 33, to a voltage VSE, which is higher than the voltage Vcc. The output signal of the AND circuit 33 is connected to a gate of an N channel transistor 35 constituting the level converter 34, and connected to a gate of an N channel transistor 37 through an inverter 36. The sources of these transistors 35 and 37 are grounded. The drain of the transistor 35 is connected to a drain of a P channel transistor 38, and connected to a gate of a P channel transistor 39. A drain of the transistor 37 is connected to a drain of the P channel transistor 39, and connected to the gate of the P channel transistor 38. The voltage VSE for erasing is supplied to each source of the transistors 38 and 39. The block selection signal B0 is outputted from the drain of the transistors 37 and 39, and the block selection signal /B0 is outputted from the drain of the transistors 35 and 38.

In the above-mentioned structure, if the block decoder is selected by the column address when erasing, a high level signal of the voltage Vcc is outputted from the AND circuit 33, and the signal is converted to the signal of the voltage VSE by the level converter 34. Therefore, the block selection signal B0 is set to be in a level of the voltage VSE, and the block selection signal /B0 is in a ground level. At this time, in the non-selected block, the level of the block selection signal is reversed. Also, at the time of non-erasing, since the erase control signal E is set to be in a low level, the level of the block selection signal is the same as the case of the non-selection.

If the supply circuit SC1 is selected by the block selection signals B0 and /B0, the transfer gate 31 is in a conductive state, and the sector selection signal SI, which is outputted from the source main decoder SMD through the transfer gate 31, is supplied to the source line SL. If the supply circuit SC1 is non-selected by the block selection signals B0 and /B0, the transfer gate 31 is in a non-conductive state, and the transistor 32 for resetting is in a conductive state. Due to this, the source line SL is grounded.

As mentioned above, at the time of non-erasing, the transfer gate of the supply circuit, which constitutes the source sub-decoder in all sectors, is in the non-conductive state, and the transistor for resetting is in the conductive state. Due to this, the source line is grounded regardless of the address signal. On the other hand, at the time of erasing, only the source line SL, which is selected by the sector selection signal SI and the block selection signal, becomes voltage VSE, and the other lines are in ground level. In other words, if the block selection signal is in a non-selected state even if the sector selection signal SI is a selected state, the transfer gate of the supply circuit is set to be in a non-conductive state and the transistor for resetting is set to be in a conductive state, and the source line SL is grounded. Also, in the case that the block selection signal is in a selected state and the the sector selection signal SI is in a non-selected state, the source line SL is in a ground level even if the transfer gate of the supply circuit is in a conductive state since the sector selection signal SI is in a ground level.

In FIGS. 2 and 3, the sector is selected by one type of sector selection signal SI and reciprocal block selection signals B0 and /B0. However, the present invention is not limited to the above case. The sector can be also selected by reciprocal sector selection signals SI and /SI and one type of block selection signal B0.

Figure 4:
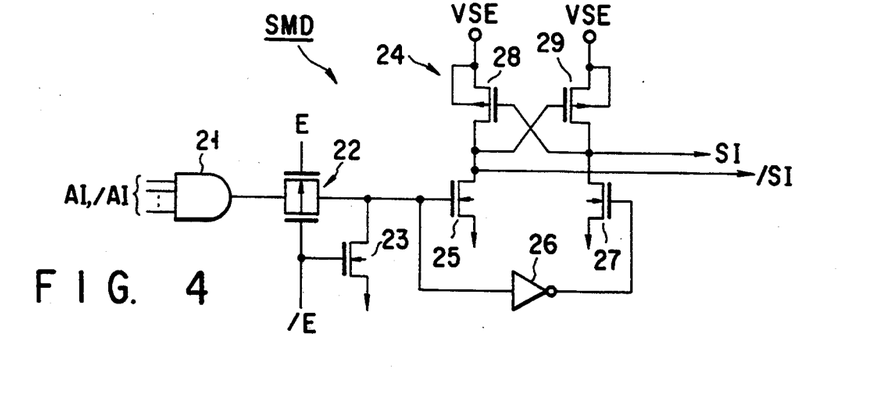
FIG. 4 is a circuit view showing the other example of a source main decoder shown in FIG. 1.
Figure 5:
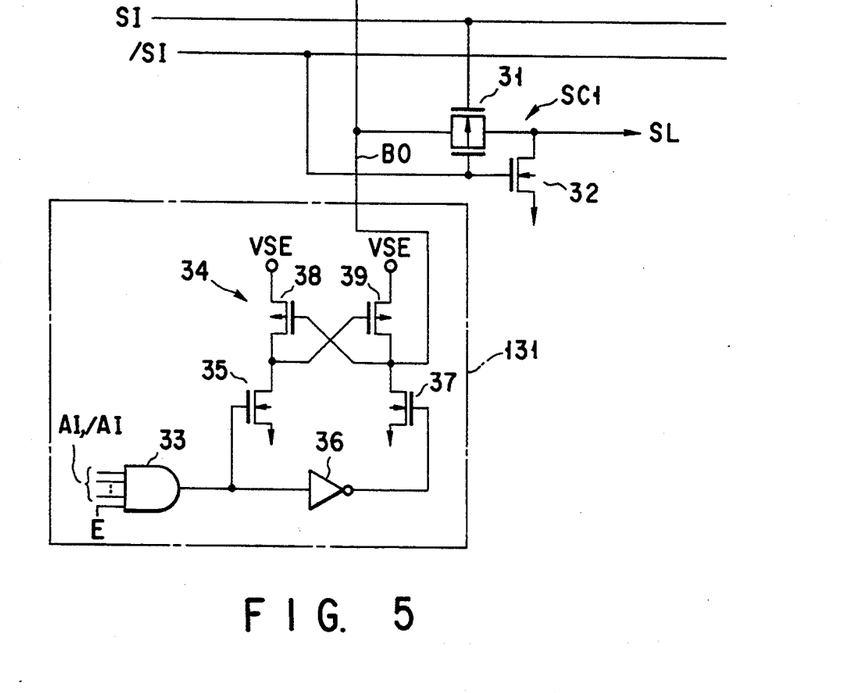
FIG. 5 is a circuit view showing the other example of a source sub-decoder shown in FIG. 1.

FIG. 4 shows the other example of the source main decoder SMD, and FIG. 5 shows the other example of the supply circuit SC1 constituting the source sub-decoder SSD. In FIGS. 4 and 5, the same reference numerals are added to the same portions as FIGS. 2 and 3, and only the different portions from the FIGS. 2 and 3 will be explained.

In FIG. 4, the sector selection signal SI is outputted from the drains of the transistors 27 and 29 of the source main decoder SMD, and the sector selection signal /SI is outputted from the drains of the transistors 25 and 28.

In FIG. 5, only the block selection signal B0 is outputted from the block decoder 131. The block selection signal B0 is supplied to the input terminal of the transfer gate 31 of the supply circuit SC1. The sector selection signal SI is supplied to the gate of the N channel transistor constituting the transfer gate 31. The sector selection signal /SI is supplied to the gate of the P channel transistor constituting the transfer gate 31 and the gate of the N channel transistor 32 for reset.

According to the above-mentioned structure, the predetermined sector is selected by the sector selection SI and /SI, which are outputted from the source main decoder SMD, and the block selection signal BO, which is outputted from the block decoder. In other words, the transfer gate of the supply circuit SC1 is conductive in accordance with the sector selection signal SI and /SI. The block selection signal BO of the voltage VSE is supplied to the source line SL through the transfer gate 31. Even if such the structure is used, the same technical advantage as FIGS. 2 and 3 can be obtained.

Figure 6:
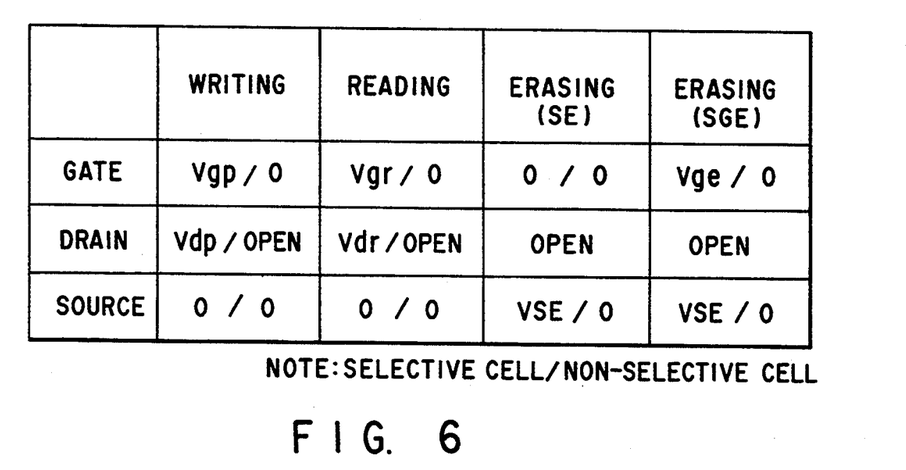
FIG. 6 is a view showing the relationship between electrical potentials in each operation mode of FIG. 1.

FIG. 6 shows the relationship between the respective input terminals of the cell transistor in the respective operation modes. The source is grounded to all sectors at the time of reading and writing. Then, at the time of erasing, the erase voltage VSE is supplied to the source in only the selected sector, and the non-selected sector is in a ground level.

According to the above embodiment, the source decoder, which is conventionally provided in every block, is divided into one source main decoder SMD and a plurality of source sub-decoders SSD. Only the source sub-decoders are arranged in every each block. Also, the source main decoder SMD has the decoder 11 and the level converter 12, and each of the source sub-decoders is constituted by only the supply circuit. Due to this, the pattern area of each of the source sub-decoders is smaller than that of the source main decoder. Therefore, the pattern area of the source main decoder, from being increased in dividing the word line, and the enlargement of the chip size can be controlled.

Moreover, since the chip size can be largely reduced when dividing the word lines, the limitation of the number of cells to be connected to the word lines can be relaxed in view of both the sector size and access time. Due to this, the degree of freedom of the dividing system of the memory cell array is increased.

The above embodiment explained the case of the sector erasing of a unit of 512 B. Due to this, in the above embodiment, the sector selection signal SI and the block selection signal BI (I=0 to n) is selected one by one in accordance with the inputted address signal, and only one sector selected by these signals is erased. However, in this system, the large number of sectors is sequentially erased. Due to this, in the case of a large amount of data to be erased, erasing time of n number of sectors is T×n (T: time which is required to erase one sector), and erasing is not efficiently performed. Therefore, it is desirable that the plurality of the sectors be selected and erased at the same time, so that erasing time and sector erasing can be controlled at the same time with the sector erasing regardless of the amount of erasing data.

Figure 7:
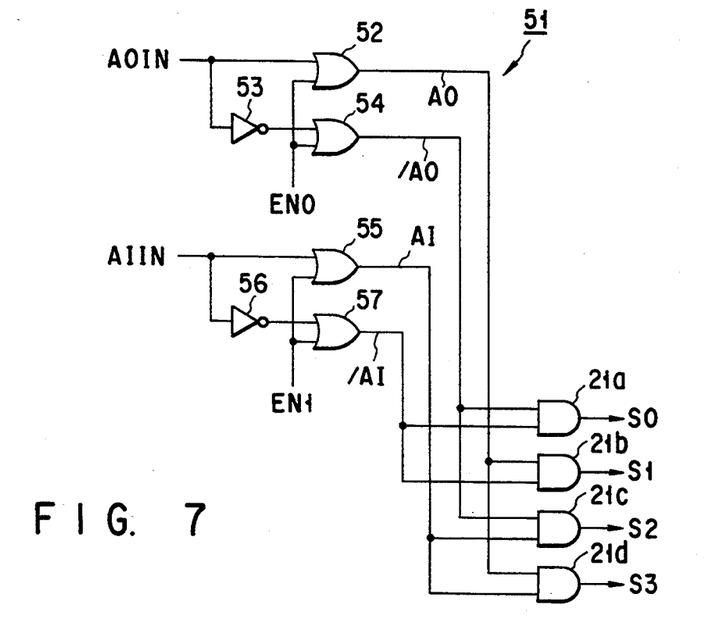
FIG. 7 is a second embodiment of the present invention, and is a circuit diagram showing one example of an address controller, which can select a plurality of sectors at the same time.

FIG. 7 shows a second embodiment of the present invention showing the case that the plurality of sectors can be selected at the same time. FIG. 7 shows a part of the source main decoder shown in FIGS. 2 and 4. In FIG. 7, each of AND circuits 21a to 21d is provided to each corresponding sector of the source main decoder SMD. Each of the output terminals of the AND circuits 21a to 21d is connected to the transfer gate shown in FIGS. 2 and 4. An address controller 51 is provided in the input terminals of the AND circuits 21a to 21d. The address controller 51 generate control address signals A0, /A0, A1, and /A1 in accordance with input address signals A0IN and A1IN.

In the address controller 51, the input address signal A0IN is supplied to one input terminal of an OR circuit 52, and supplied to one input terminal of an OR circuit 54 through an inverter 53. An erase control signal EN0 is supplied to other input terminal of each of the OR circuits 52 and 54. The output terminal of the OR circuit 52 is connected to one input terminal of each of the AND circuits 21b and 21d, and the output terminal of the OR circuit 54 is connected to one input terminal of each of the AND circuits 21a and 21c.

Also, the input address signal A1IN is supplied to one input terminal of an OR circuit 55, and supplied to one input terminal of an OR circuit 57 through an inverter 56. An erase control signal EN1 is supplied to other input terminal of each of the OR circuits 55 and 57. The output terminal of the OR circuit 55 is connected to one input terminal of each of the AND circuits 21c and 21d, and the output terminal of the OR circuit 57 is connected to one input terminal of each of the AND circuits 21a and 21b.

In the above-mentioned structure, in the case that both erase control signals EN0 and EN1 are in a low level, the address controller 51 outputs address signals A0, /A0, A1, and /A1 in accordance with the input address signals A0IN and A1IN. Due to this, a high level signal is outputted from one AND circuit, and one sector is selected.

On the other hand, if only erase control signal EN0 is in a high level, both address signal A0 and /A0 are in a high level regardless of the input address signal A0IN. Due to this, if the input address A1IN is in a low level, the AND circuits 21a and 21b are selected, and the output signals S0 and S1 are in a high level. Also, if the input address signal A1IN is in a high level, the AND circuit 21c and 21d are selected, and the output signals S2 and S3 are in a high level. Moreover, if the erase control signal EN1 is in a high level, the AND circuits 21a and 21c or the AND circuits 21b and 21d are selected at the same time. Furthermore, if both erase control signals EN0 and EN1 are in a high level, all AND circuits 21a to 21d can be selected at the same time.

As mentioned above, reciprocal address signals AI and /AI (I=0, 1) are set in a high level at the same time, so that the plurality of sector selection signals can be selected at the same time. Therefore, the plurality of sectors can be selected and erase at the same time.

Moreover, if the address controller 51 of FIG. 7 is connected to the input terminal of the AND circuit 33 of the block decoder 131 (~13n) of FIG. 5, the plurality of block selection signals can be selected at the same time. The number of sectors, and the number of blocks can be arbitrarily set from exponentiation of 2 based on the number of addresses to be controlled. Thereby, data can be erased at the unit of 512 B×n (n=2,4,8 . . . ) without increasing the erasing time.

Figure 8:
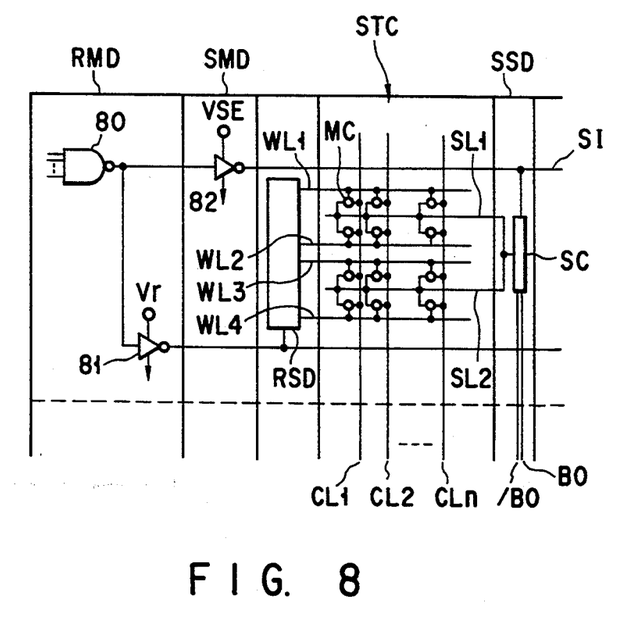
FIG. 8 is a third embodiment of the present invention, and is a schematic structural view showing a combination of a double word line system and the present invention.

FIG. 8 shows the third embodiment of the present invention combining a double word line system into the present invention. The double word line system is conventionally used to control the delay of the word lines and to prevent the chip size from being increased by a row decoder.

In FIG. 8, the row decoder is divided into a row main decoder RMD and a row sub-decoder RSD. The row main decoder RMD is provided to be adjacent to the source main decoder SMD, and the row sub-decoder RSD is provided every block of the divided word lines. The row main decoder RMD comprises a decoder 80, which decodes a row address signal, and a level converter 81. The output signal of the decoder 81 is supplied to the level converter 81 for word lines, and converted to a voltage Vr of the word lines by the level converter 81. A plurality of row sub-decoders RSD are connected to the output terminal of the level converter 81. Then, for example, four word lines WL1 to WL4 are connected to each of the row sub-decoders RSD. Similar to FIG. 1, the memory cell MC is connected to each of these word lines WL1 to WL4.

Also, the output signal of the row main decoder RMD is supplied to the source main decoder SMD. As explained above, the level converter 82 is provided in the source main decoder SMD. The input signal is converted to the erase voltage VSE by the level converter 82. The converted signal is supplied to the supply circuit SC constituting each of the source sub-decoder SSD.

According to the above structure, the row main decoder RMD decodes the row address signal, and selects word lines by the unit of four lines. The row sub-decoders further decode the row address signal to the output of the row main decoder RMD, and select one word line.

According to the above embodiment, the unit of the word lines selected by the row main decoder RMD is adjusted to the number of lines constituting one line. Therefore, the decoder 80 for the row main decoder can be used as the decoder for the source main decoder SMD. Due to this, in the source main decoder, only the level converter may be provided, so that the increase in the chip size can be further controlled.

What is claimed is:

1. A nonvolatile semiconductor memory device, comprising:
    a memory cell array including a plurality of sectors arranged in rows and columns, each of said sectors including a plurality of word lines, a plurality of bit lines arranged to cross said word lines, and a plurality of memory cells, each memory cell including a transistor having a gate connected to one of said word lines and a current path having a first end connected to one of said bit lines and a second end;
    first selecting means for selecting sectors arranged in one of said rows in accordance with an address signal so as to output an erase voltage;
    second selecting means for selecting sectors arranged in one of said columns in accordance with the address signal; and
    supplying means, each provided in a corresponding one of said sectors, for supplying said erase voltage outputted from said first selecting means to the second ends of the current paths of said transistors in the corresponding sector.

2. The device according to claim 1, wherein said first selecting means comprises decoding means for decoding a row address signal, and converting means for converting an output signal of said decoding means to a signal whose level is higher than a high level signal of the row address signal.

3. The device according to claim 1, wherein said second selecting means comprises decoding means for decoding a column signal, and converting means for converting an output signal of said decoding means to a signal whose level is higher than a high level signal of the column signal.

4. The device according to claim 1, wherein each of said supplying means includes a transfer gate, which is selected to be electrically conductive by said second selecting means, for transferring the erase voltage outputted from said first selecting means to the second ends of the current paths of said transistors in the corresponding sector.

5. The device according to claim 1, wherein each of said memory cells is an EPROM cell, and said first end of said current path is a drain of the transistor included in the EPROM cell and the second end of said current path is a source of the transistor included in the EPROM cell.

6. The device according to claim 1, wherein each of said sectors includes at least four word lines, and memory cells for at least 1 Kb of data are connected to each word line.

7. A nonvolatile semiconductor memory device, comprising:
    a memory cell array having a plurality of blocks arranged in a column direction, a plurality of sections arranged in a row direction, and a plurality of sectors, said sectors being formed in areas where said sections and said blocks cross, each of said sectors including a plurality of word lines, a plurality of bit lines arranged to cross said word lines, source lines, and a plurality of memory cells, each memory cell including a transistor having a gate connected to one of said word lines, a drain connected to one of said bit lines, and a source connected to one of said source lines;
    first selecting means, provided in each of said sections, for selecting at least one section in accordance with an address signal so as to output a signal for selecting said section;
    second selecting means, provided in each of said blocks, for selecting at least one block in accordance with the address signal; and
    supplying means, each provided in a corresponding one of said sectors, and selected by said first and second selecting means, for supplying an output signal of said first selecting means as an erase voltage to the source lines included in the corresponding sector.

8. The device according to claim 7, wherein said first selecting means comprises decoding means for decoding a row address signal, and converting means for converting an output signal of said decoding means to a signal whose level is higher than a high level signal of the row address signal.

9. The device according to claim 7, wherein said first selecting means includes a logic circuit to which a row address signal and an erase control signal are supplied, and said logic circuit selects a plurality of sectors at the same time in accordance with said row address signal when said erase control signal is in an active state.

10. The device according to claim 7, wherein said second selecting means comprises decoding means for decoding a column signal, and converting means for converting an output signal of said decoding means to a signal whose level is higher than a high level signal of the column signal.

11. The device according to claim 7, wherein each of said supplying means includes a transfer gate, which is selected to be electrically conductive by said second selecting means, for transferring the erase voltage outputted from said first selecting means to the source lines included the corresponding sector.

12. The device according to claim 7, wherein each of said memory cells is an EPROM cell.

13. The device according to claim 7, wherein each of said sectors includes at least four word lines, and memory cells for at least 1 Kb of data are connected to each word line.

14. A nonvolatile semiconductor memory device, comprising:
- a memory cell array having a plurality of blocks arranged in a column direction, a plurality of sections arranged in a row direction, and a plurality of sectors, said sectors being formed in areas where said sections and said blocks cross, each of said sectors including a plurality of word lines, a plurality of bit lines arranged to cross said word lines, source lines, and a plurality of memory cells, each of said memory cells including a transistor having a gate connected to one of said word lines, a drain connected to one of said bit lines, and a source connected to one of said source lines;
- first selecting means, provided in each of said sections, for selecting at least one section in accordance with an address signal so as to output a signal for selecting said section;
- second selecting means, provided in each of said blocks, for selecting at least one block in accordance with the address signal;
- supplying means, each provided in a corresponding one of said sectors, and selected by said first and second selecting means, for supplying an output signal of said first selecting means as an erase voltage to the source lines included in the corresponding sector; and
- third selecting means, each provided in a corresponding one of said sectors, for selecting word lines of the corresponding sector in accordance with the output signal of said first selecting means.

15. The device according to claim 14, wherein said first selecting means comprises a row main decoder for decoding a row address signal, and said third selecting means comprises a row sub-decoder for selecting the word lines of the corresponding sector in accordance with the output signal of said row main decoder.

16. The device according to claim 15, further comprising a source main decoder connected to said row main decoder, and said source main decoder including converting means for converting an output signal of said row main decoder to said erase voltage whose level is higher than the high level signal of the row address signal.

17. The device according to claim 16, wherein said supplying means constitutes a source sub-decoder, said source sub-decoder includes a transfer gate, which is selected to be electrically conductive by said second selecting means, for transferring the erase voltage outputted from said first selecting means to the source lines included in the corresponding sector.

18. The device according to claim 14, wherein said second selecting means comprises decoding means for decoding a column signal, and converting means for converting an output signal of said decoding means to a signal whose level is higher than a high level signal of the column signal.

19. The device according to claim 14, wherein each of said memory cells is an EPROM cell.

20. The device according to claim 14, wherein each of said sectors includes at least four word lines, and memory cells for at least 1 Kb of data are connected to each word line.

* * * * *